(12) United States Patent
Unnikrishnan et al.

(10) Patent No.: US 10,495,693 B2
(45) Date of Patent: Dec. 3, 2019

(54) WIND TURBINE FAULT DETECTION USING ACOUSTIC, VIBRATION, AND ELECTRICAL SIGNALS

(71) Applicant: General Electric Company, Schenectady, NY (US)

(72) Inventors: Jayakrishnan Unnikrishnan, Schenectady, NY (US); Lijun He, Schenectady, NY (US); Brett Alexander Matthews, Albany, NY (US); Liwei Hao, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 243 days.

(21) Appl. No.: 15/610,992

(22) Filed: Jun. 1, 2017

(65) Prior Publication Data

US 2018/0348303 A1    Dec. 6, 2018

(51) Int. Cl.
*G01R 31/34* (2006.01)
*G01H 1/00* (2006.01)
(Continued)

(52) U.S. Cl.
CPC ......... *G01R 31/343* (2013.01); *F03D 7/0296* (2013.01); *F03D 17/00* (2016.05); *G01H 1/003* (2013.01); *G01H 3/12* (2013.01); *F05B 2270/333* (2013.01); *F05B 2270/334* (2013.01); *G01R 31/34* (2013.01)

(58) Field of Classification Search
CPC .. F03D 17/00; F03D 7/0296; F05B 2270/333; F05B 2270/334; G01H 1/003; G01H 3/12; G01R 31/343; G01R 31/346

USPC ..... 702/56, 183, 185, 48, 54; 324/71.1, 228, 324/522, 761.01; 73/579, 645
See application file for complete search history.

(56) References Cited

U.S. PATENT DOCUMENTS 4,261,206 A    4/1981    Futakawa et al.
4,542,649 A    9/1985    Charbonneau et al.
(Continued)

FOREIGN PATENT DOCUMENTS

WO    WO2011006528 A1    1/2011
WO    WO2015065873 A2    5/2015

OTHER PUBLICATIONS

Fisher et al., VGB Research Project 383—Condition monitoring of wind turbines, Apr. 1, 2016.*
(Continued)

*Primary Examiner* — John H Le
(74) *Attorney, Agent, or Firm* — Dority & Manning, P.A.

(57) ABSTRACT

Systems and methods for detecting faults are provided. A method for determining a fault condition for a component of a drivetrain in a wind turbine can include receiving an acoustic signal from an acoustic signal measuring device. The method can further include receiving a vibration signal from a vibration signal measuring device. The method can further include analyzing the acoustic signal to determine an analyzed acoustic signal. The method can further include analyzing the vibration signal to determine an analyzed vibration signal. The method can further include determining a fault condition for the component based at least in part on the analyzed acoustic signal and analyzed vibration signal. The fault condition can further be determined based at least in part on an analyzed electrical signal.

20 Claims, 7 Drawing Sheets

(51) Int. Cl.
*G01H 15/00* (2006.01)
*F03D 7/02* (2006.01)
*F03D 17/00* (2016.01)
*G01H 3/12* (2006.01)

(56) References Cited

U.S. PATENT DOCUMENTS

| | | | |
|---|---|---|---|
| 4,965,513 | A | 10/1990 | Haynes et al. |
| 5,995,910 | A | 11/1999 | Discenzo |
| 6,065,332 | A | 5/2000 | Dominick |
| 6,338,029 | B1 | 1/2002 | Abbata et al. |
| 6,469,504 | B1 | 10/2002 | Kliman et al. |
| 7,322,794 | B2 | 1/2008 | Lemieux et al. |
| 8,451,134 | B2 | 5/2013 | Bharadwaj et al. |
| 9,267,864 | B2 * | 2/2016 | Klein-Hitpass ..... G01M 13/028 |
| 9,541,606 | B2 | 1/2017 | Neti et al. |
| 2005/0200378 | A1 | 9/2005 | Hobelsberger et al. |
| 2005/0218358 | A1 | 10/2005 | Sterner et al. |
| 2006/0071666 | A1 | 4/2006 | Unsworth et al. |
| 2008/0065281 | A1 | 3/2008 | Tran |
| 2008/0144927 | A1 | 6/2008 | Hashimoto et al. |
| 2010/0141441 | A1 | 6/2010 | Luo et al. |
| 2010/0143117 | A1 | 6/2010 | Xiong |
| 2010/0211334 | A1 | 8/2010 | Sheikman et al. |
| 2011/0018727 | A1 | 1/2011 | Bharadwaj et al. |
| 2012/0321464 | A1 | 12/2012 | Andersen et al. |
| 2013/0049733 | A1 * | 2/2013 | Neti ..................... G01R 31/343 324/71.1 |
| 2014/0167810 | A1 | 6/2014 | Neti et al. |
| 2014/0193257 | A1 | 7/2014 | Ormel et al. |
| 2014/0260634 | A1 | 9/2014 | Newman |
| 2016/0245263 | A1 | 8/2016 | Ikeda et al. |

OTHER PUBLICATIONS

Yao et al., "Wind Turbine Gearbox Fault Diagnosis Using Adaptive Morlet Wavelet Spectrum", Second International Conference on Intelligent Computation Technology and Automation, ICICTA, http://ieeexplore.ieee.org/document/5287747/, Oct. 10-11, 2009.

Liu et al., "Bi-spectrum Analysis for Feature Extraction of Pitting Fault in Wind Turbine Gearbox", International Conference on Mechatronics and Automation (ICMA), http://ieeexplore.ieee.org/document/5589326/, Aug. 4-7, 2010.

Ye et al., "Using SCADA Data Fusion by Swarm Intelligence for Wind Turbine Condition Monitoring", Fourth Global Congress on Intelligent Systems (GCIS), http://ieeexplore.ieee.org/document/6805937/, Dec. 3-4, 2013.

Vanraj et al., "Intelligent Predictive Maintenance of Dynamic Systems using Condition Monitoring and Signal Processing Techniques—A Review", International Conference on Advances in Computing, Communication, & Automation (ICACCA), http://ieeexplore.ieee.org/document/7578870/, Apr. 8-9, 2016.

"Condition Monitoring Service Offers Early-Warning Against Large Motor Failure", Downloaded from internet: <http://www.abb.co.in/cawp/seitp202/091dbb6527e406aec125784f004891da.aspx> on Dec. 26, 2012, ABB News Release UK, Mar. 10, 2011, 1 Page.

Tran_et al., "A Rapid Helicopter Drive Train Fault Detection Using Neuro-Fuzzy Method", 3 pages.

* cited by examiner

WIND TURBINE FAULT DETECTION USING ACOUSTIC, VIBRATION, AND ELECTRICAL SIGNALS

GOVERNMENT SUPPORT CLAUSE

This invention was made with Government support under Contract No. DE-EE0006802, awarded by the Department of Energy. The Government has certain rights in the invention.

FIELD

The present disclosure relates generally to wind turbines, and more particularly to methods and systems for improved detection of faults in various components of drivetrains in wind turbines.

BACKGROUND

Generally, a wind turbine includes a rotor that includes a rotatable hub assembly having multiple blades. The blades transform wind energy into a mechanical rotational torque that in turn drives a drivetrain coupled to an electrical generator. However, electrical generators, motors and the drive train in a wind turbine may generate torsional and radial vibrations due to presence of defective components such as bearings, gears, or the like. Conventionally, vibration analysis of components in a wind turbine can be performed to monitor operating conditions. For example, mechanical faults in wind turbines having a drive train may generate vibrations at the rotor rotating frequency. However, it has been found that vibration signals may not detect all types of faults associated with the various components of the drive train.

BRIEF DESCRIPTION

Aspects and advantages of the invention will be set forth in part in the following description, or may be obvious from the description, or may be learned through practice of the invention.

One example aspect of the present disclosure is directed to a method for determining a fault condition for a component of a drivetrain in a wind turbine. The method can include receiving an acoustic signal from an acoustic signal measuring device. The method can further include receiving a vibration signal from a vibration signal measuring device. The method can further include analyzing the acoustic signal to determine an analyzed acoustic signal. The method can further include analyzing the vibration signal to determine an analyzed vibration signal. The method can further include determining a fault condition for the component based at least in part on the analyzed acoustic signal and analyzed vibration signal.

Another example aspect of the present disclosure is directed to a control system. The control system can include an acoustic signal measurement device, an electrical signal measurement device, a vibration signal measurement device, and one or more processors and one or more memory devices configured to store instructions that when executed by the one or more processors cause the one or more processors to perform operations. The operations can include receiving first data indicative of an acoustic signal from the acoustic signal measurement device. The operations can further include receiving second data indicative of a vibration signal from the vibration signal measurement device. The operations can further include receiving third data indicative of an electrical signal from the electrical signal measurement device. The operations can further include processing the first data, second data, and third data to determine a first processed data, a second processed data, and a third processed data. The operations can further include determining a fault condition based at least in part on the first processed data, the second processed data, and the third processed data.

Yet another example aspect of the present disclosure is directed to a wind turbine system. The wind turbine system can include a wind turbine, which can include a drivetrain. The drivetrain can include a plurality of components. The plurality of components can include a plurality of bearings, races, and gears. The wind turbine system can also include an acoustic signal measurement device, an electric signal measurement device, a vibration signal measurement device, and one or more processors and one or more memory devices configured to store instructions that when executed by the one or more processors cause the one or more processors to perform operations. The operations can include receiving first data indicative of an acoustic signal from the acoustic signal measurement device. The operations can further include receiving second data indicative of a vibration signal from the vibration signal measurement device. The operations can further include receiving third data indicative of an electrical signal from the electrical signal measurement device. The operations can further include processing the first data, second data, and third data to determine a first processed data, a second processed data, and a third processed data. The operations can further include determining a fault condition based at least in part on the first processed data, the second processed data, and the third processed data.

Variations and modifications can be made to these example embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
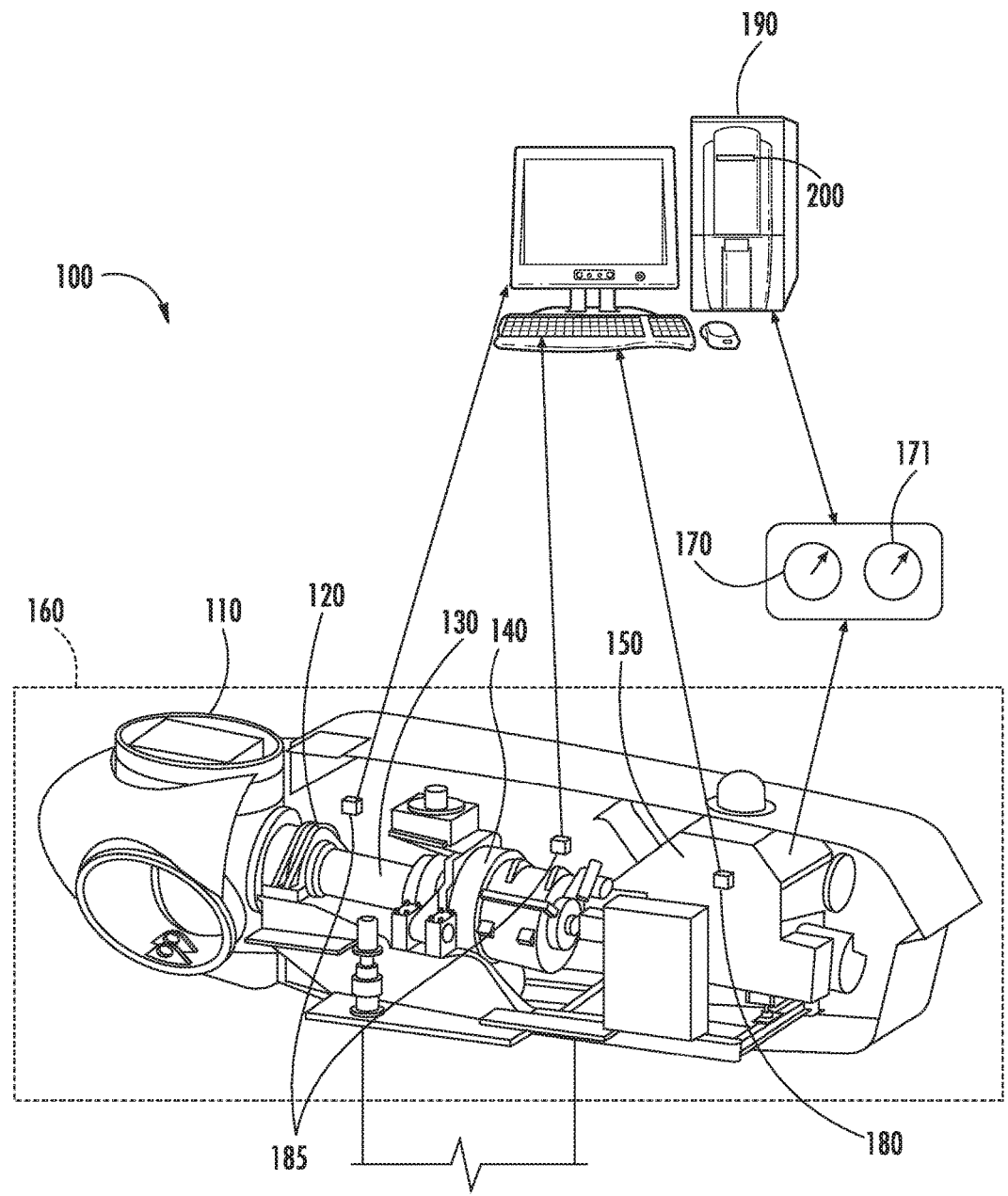
FIG. 1 depicts a diagrammatic illustration of a system having a fault detection system according to example aspects of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, example aspects of the present disclosure are directed to systems and methods for detecting fault conditions. More particularly, a wind turbine system can include a drivetrain, which can include a plurality of components, such as gears, bearings, races, or other components. The wind turbine system can include a control system, such as a control system with one or more processors and one or more memory devices. The one or more processors can be configured to receive signals from one or more acoustic signal measuring devices, vibration signal measuring devices, and electrical signal measuring devices.

A method for determining a fault condition can include receiving an acoustic signal from an acoustic signal measuring device and receiving a vibration signal from a vibration signal device. For example, a processor can be configured to receive data indicative of an acoustic signal and data indicative of a vibration signal. An acoustic signal measuring device can be, for example, a microphone or an array of microphones positioned proximate to a an examined mechanical device, such as a drivetrain in a wind turbine. Similarly, a vibration signal measuring device can be, for example, an accelerometer or other vibration signal measuring device positioned on a gearbox of the wind turbine.

The method can also include analyzing the acoustic signal to determine an analyzed acoustic signal, and analyzing the vibration signal to determine an analyzed vibration signal. For example, the processor can be configured to perform the signal analysis. The method can also include determining a fault condition based at least in part on the analyzed acoustic signal and the analyzed vibration signal.

For example, in an embodiment, analyzing the acoustic signal to determine an analyzed acoustic signal can include extracting an envelope of the signal and estimating a power spectral density ("PSD") for the acoustic signal. Similarly, an envelope can be extracted from the vibration signal, and a PSD for the envelope of the vibration signal can be estimated. Additionally, a fault condition can be determined based on the analyzed signals. For example, the PSD of the envelope of the analyzed the envelope of acoustic signal can be compared to a first threshold at a signature fault frequency, and the PSD of the envelope of the analyzed vibration signal can be compared to a second threshold at the signature fault frequency. The signature fault frequency can be, for example, a frequency associated with a specific type of fault, such as a chipped tooth on a gear, a defective ball bearing, or a worn component. In one or more embodiments, the signature fault frequencies can be one or more predicted fault frequencies, wherein the predicted fault frequency is a frequency where an analyzed signal is expected to exhibit a particular characteristic, such as an elevated energy level due to the nature of the fault. For example, a predicted fault frequency can be calculated based on a shaft rotation frequency or a mesh frequency for a gear. In an embodiment, a fault condition can be determined to exist when the analyzed acoustic signal exceeds the first threshold, and the analyzed vibration signal exceeds the second threshold.

The method can further include receiving an electrical signal from an electrical signal measuring device. For example, a voltage sensor or a current sensor can be configured to measure an electrical signal, such as an electrical signal from a generator coupled to a drivetrain in a wind turbine. The method can further include analyzing the electrical signal to determine an analyzed electrical signal. In an embodiment, a fault condition can additionally be based at least in part on the analyzed electrical signal. For example, an acoustic signal, a vibration signal, and an electrical signal can all be analyzed to determine respective analyzed signals. In an embodiment, analyzing each of the acoustic signal, the vibration signal, and the electrical signal can include estimating a PSD for each signal. For example, an envelope can be extracted and/or a PSD estimation can be performed, such as a Welch PSD estimation.

The method can further include extracting one or more fault signature amplitudes for each of the acoustic signal, the vibration signal, and the electrical signal. For example, the one or more fault signature amplitudes can be extracted based at least in part on each respective signal and a respective baseline signal. For example, a baseline signal can be obtained from a device in which no fault condition exists. For example, an acoustic signal can be obtained for a drivetrain of a healthy wind turbine, or an electrical signal can be obtained from a generator coupled to a drivetrain of a wind turbine. The baseline signal can similarly be analyzed, such as by extracting an envelope and estimating a PSD of the signal at one or more signature fault frequencies. The signature fault frequencies can be, for example, frequencies associated with a particular fault, such as one or more predicted fault frequencies. In an embodiment, significant fault signature amplitudes can be extracted at the signature fault frequencies, while insignificant fault signature amplitudes can be discarded. In this way, fault signature amplitudes in which a significant difference between a signal and a respective baseline signal can be used for further analysis.

In an embodiment, analyzing each of the acoustic signal, the vibration signal, and the electrical signal can include determining a weighting parameter for each respective signal. For example, a weighting parameter can be determined for each respective signal, and can be based on a mean value and a variance value of a difference between the respective signal and a respective baseline signal at one or more signature fault frequencies. Further, a fault condition can be determined based at least in part on the weighting parameter for each respective signal. For example, each respective signal can be combined with a respective weighting parameter for each signature fault frequency extracted from the signal. A fused signal can be created by combining the weighted signature fault frequency amplitudes for each signal at the signature fault frequencies. In an embodiment, a fault condition can be determined to exist when the fused signal exceeds a threshold. For example, a threshold can be set based at least in part on a particular type of fault condition, such as a gear with a chipped tooth, or a defective ball bearing. The fused signal can be compared to the threshold, and when the fused signal exceeds the threshold, a fault condition can be determined to exist. In an embodiment, a plurality of thresholds can be used, such as thresholds associated with various wear levels for specific components.

In this way, the systems and methods according to example aspects of the present disclosure can have a technical effect of allowing for the detection of fault conditions, such as fault conditions in a component of a drivetrain in a wind turbine based on acoustic, vibration, and/or electrical signals. Further, the systems and methods according to example aspects of the present disclosure can allow for fusing of a plurality of signals, which can allow for an increased efficiency for the processing of acoustic, vibration, and electrical signals. Moreover, the systems and methods according to example aspects of the present disclosure can allow for diagnosing and predicting component failures, which can enable preventive maintenance to be performed before a fault condition occurs, thereby allowing for a reduction in the necessary downtime for unscheduled maintenance.

With reference now to the FIGS., example aspects of the present disclosure will now be discussed in detail. FIG. 1 is a diagrammatic illustration of a system 100 in accordance with example aspects of the present disclosure. The system 100 includes a wind turbine 160 having at least one electrical device 150 and a mechanical device 140. The system 100 further includes at least one electrical signal measuring device 170, 171 to measure electrical signals, at least one vibration signal measuring device 180 to measure vibrations from the wind turbine 160, and at least one acoustic signal measuring device 185 to measure acoustic signals from the wind turbine 160. The number of electrical signal, vibration signal, and acoustic signal measuring devices may vary depending on the application. In one embodiment, only one electrical signal, one vibration signal, and one acoustic signal measuring device may be included in a system 100. Additionally and/or alternatively, a plurality of each type of signal measuring device can be included in a system 100. For example, an array of acoustic signal measuring devices 185, such as an array of microphones, can be positioned along the axis of a drivetrain 140 in a wind turbine 160.

The system 100 can further include a control device 190 for receiving electrical signals, vibration signals, and acoustic signals measured by the electrical signal measuring device(s) 170, 171, the vibration signal measuring device(s) 180, and the acoustic signal measuring device(s) 185. The wind turbine 160 also includes a rotor assembly 110, a main bearing 120, and a main shaft 130. In the illustrated embodiment, the electrical device 150 is a generator for generating output power 208, and the mechanical device 140 is a drivetrain. It should be noted herein that the electrical device 150 may be referred to as a motor and the mechanical device 140 may be referred to as a gearbox/drivetrain interchangeably. In other embodiments, other types of electrical and mechanical devices are envisioned.

In the illustrated embodiment, the electrical signal measuring device 170 is a current sensor for sensing current and the other electrical signal measuring device 171 is a voltage sensor for sensing voltage of the generator 150. The electrical signal measuring devices 170, 171 may be referred to as current sensor and voltage sensor interchangeably. In one embodiment, the current sensor 170 measures current flowing through one or more phases of the generator 150. Similarly, the voltage sensor 171 may measure voltage across one or more phases of the generator 150. While certain embodiments of the present technology may be discussed with respect to a multi-phase generator, it should be noted herein that in other embodiments of the present technology, other types of wind turbines may be envisioned. The vibration signal measuring device 180 can be used to detect vibrations of at least one of the generator 150, the drivetrain 140, and other devices of the wind turbine 160. The vibrations may include at least one of stator vibrations, rotor vibrations, and bearing vibrations. The vibration signal measuring device 180 may be an accelerometer, a displacement transducer or a velocity transducer. The acoustic signal measuring device(s) 185 can be used to sense acoustic signals associated with operation of the wind turbine 160. The acoustic signal measuring device(s) 185 may also be referred to as acoustic sensors or microphones. For example, the acoustic signal measuring device(s) can be microphones configured to sense acoustic signals from the wind turbine 160, such as acoustic signals generated by operation of the drivetrain 140. Other types of vibration signal, electrical signal, and acoustic signal measuring devices may also be envisioned within the scope of the present technology.

The control device 190 can receive signals from the vibration signal measuring device 180, the electrical signal measuring devices 170, 171, and the acoustic signal measuring device(s) 185. The control device 190 may be a general purpose computer, a Digital Signal Processor (DSP), or a control device/system 810 as discussed with reference to FIG. 8. The control device 190 may include an input device (not shown) such as a keyboard, a mouse, and a controller for receiving additional information from a user to configure the control device 190 to perform various computational operations associated with the present invention. The control device 190 may include a memory 200 which may be a random access memory (RAM), read only memory (ROM), or any other form of computer readable memory accessible by the control device 190. The memory 200 may be encoded with a program to instruct the control device 190 to enable a sequence of steps to determine a fault of the drivetrain 140. The control device 190 may also be suitably configured to monitor and detect fault conditions of various components, for example, the bearing faults of the drivetrain 140, within the wind turbine 160.

Figure 2:
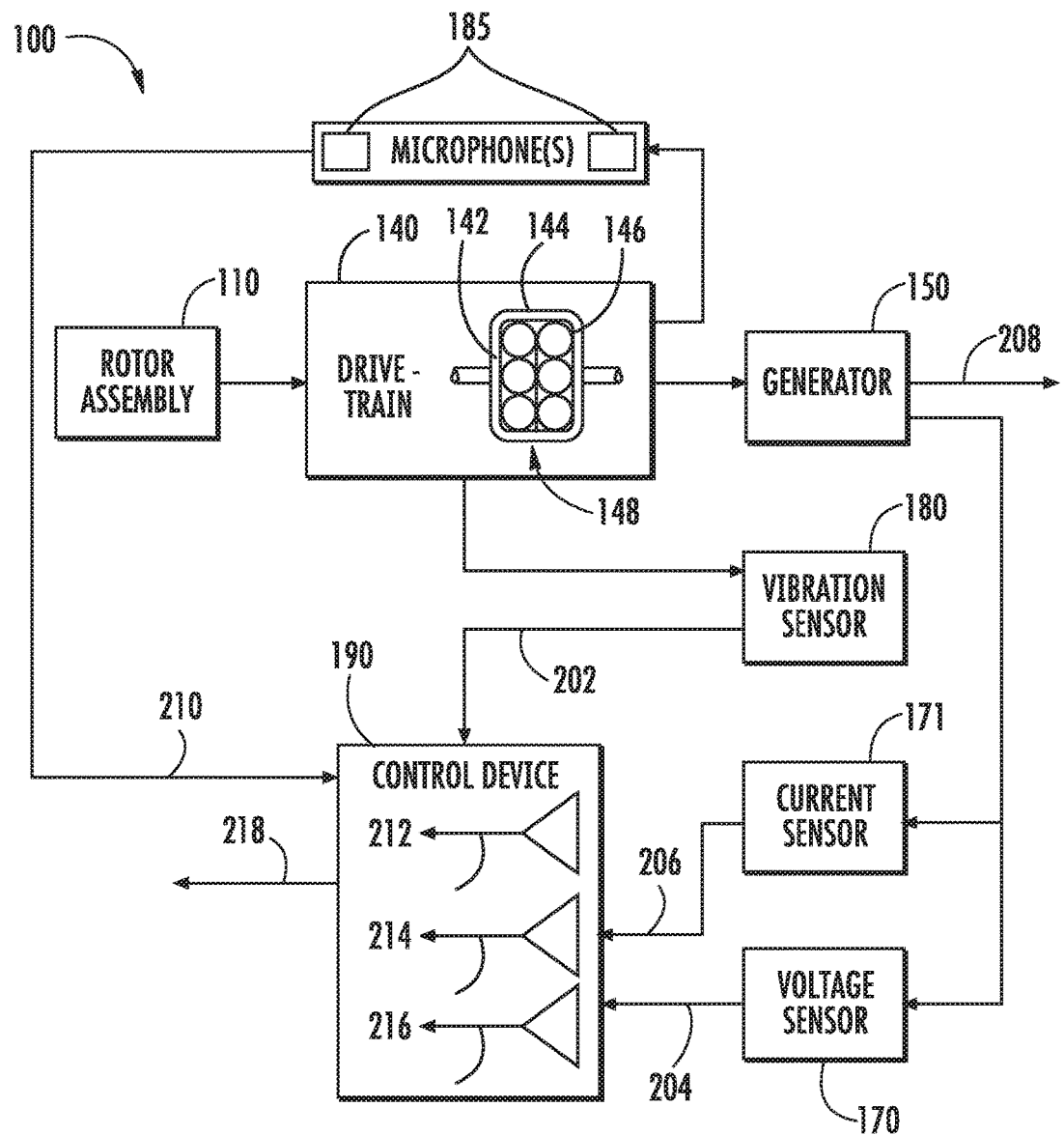
FIG. 2 depicts a block diagram of a fault detection system according to example aspects of the present disclosure.

FIG. 2 is a block diagram system 100 in accordance with an exemplary embodiment. As discussed with reference to FIG. 1, the rotor assembly 110 is coupled to the generator 150 via the drivetrain 140. Electrical signals 204, 206 measured by the electrical sensors 170, 171, vibration signals 202 measured by the vibration signal measuring devices 180, and acoustic signals 210 measured by acoustic signal measuring device(s) 185 can be received by the control device 190 to generate analyzed electrical signal 212, analyzed vibration signal 214, and analyzed acoustic signal 216, respectively. The analyzed electrical signal 212, analyzed vibration signal 214, and analyzed acoustic signal 216 can be used to determine a fault condition 218. The fault condition 218 may be representative of one or more diagnostic parameters. It should be noted herein that the terms "fault condition" and "diagnostic parameter" may be used interchangeably. In the illustrated embodiment, the fault condition 218 may be representative of various faults associated with the drivetrain 140, including but not limited to bearing faults, and gear faults of the drivetrain 140. For example, one or more gears 142, races 144, and bearings 146 or housings 148 associated with the drivetrain 140 can experience a fault. In certain embodiments, the faults of the drivetrain 140 may include but are not limited to high speed (HS) shaft gear fault, HS intermediate gear fault, planet gear fault, ring gear fault, sun gear fault, or the like. In some embodiments, additionally, the fault condition 218 may be indicative of bearing fault of the drivetrain 140 such as HS shaft bearing fault, high speed intermediate shaft (HSIS) fault, low speed intermediate shaft (LSIS) fault, planet bearing fault, or the like.

The faults of the drivetrain 140 can generate two types of vibrations, namely torsional and radial vibrations. These faults can further generate acoustic signals. Vibration signal measuring devices 180 effectively sense radial vibrations compared to sensing torsional vibrations. Acoustic signal measuring devices 185 sense acoustic signals, such as audible acoustic signals. Acoustic and vibration analysis are non-intrusive techniques for monitoring the condition of mechanical components within rotating machines. For example, the condition of a particular component may be determined by considering the frequency and magnitude of vibration signals 202 and acoustic signals 210 generated by the particular component. Generally, components in good condition, for example, gears with complete sets of teeth, generate smaller amplitude vibrations and acoustic signals than components in poor condition, for example, gears with chipped or missing teeth. The frequencies of vibrations and acoustic signals generated by the gears are unique to the gear design and shaft rotation speed. One technique of vibration and acoustic signal analysis involves analyzing frequency components of the vibration signal 202 and acoustic signal 210 measured from the drivetrain 140 and measuring the amplitude of the harmonic frequency components of the sideband of the vibration signal 202 and acoustic signal 210, and comparing with the amplitudes of adjacent harmonic frequencies.

Electrical signal measuring devices 170, 171 are effective in monitoring electrical signals of the electrical machine having drivetrain faults due to torsional vibrations. Electrical signals 204, 206 are measured by the electrical signal measuring devices 170, 171 and are transmitted to the control device 190. As discussed herein, the electrical signal 204 is voltage signal and the electrical signal 206 is a current signal. Electrical signal analysis of the electrical signals 204, 206 can be performed by the control device 190 to generate one or more analyzed electrical signals 212. Based on the analyzed electrical signals 212, corresponding drivetrain faults can be determined. In an embodiment of the present invention, a voltage signature analysis can be performed by the control device 190 to determine the drivetrain faults.

Vibration signal measuring device(s) 180 are effective in monitoring vibration signals generated by the drivetrain 140, generator 150, or other components of wind turbine 160. For example, a plurality of vibration signal measuring devices 180 may be located at predetermined locations on a gearbox casing. The control device 190 can receives vibration signals 202 representative of the detected vibrations from the vibration signal measuring device 180. The control device 190 can analyze the vibration signals 202 to generate analyzed vibration signals 214. In one embodiment, the control device 190 can analyze the vibration signals 202 by filtering, rectifying, extracting an envelope, and estimating a PSD for the vibration signals 202.

Acoustic signal measuring device(s) 185 are effective in monitoring acoustic signals generated by the drivetrain 140. For example, one or more acoustic signals can be positioned at predetermined locations within the wind turbine 160 to obtain acoustic signals associated with various components of the drivetrain 140. Acoustic signals 210 are measured by the acoustic signal measuring devices 185, and are transmitted to the control device 190. As discussed herein acoustic signal analysis of the acoustic signals 210 can be performed by the control device 190 to generate analyzed acoustic signals 216. In one embodiment, the control device 190 can analyze the acoustic signals 210 by filtering, rectifying, extracting an envelope, and estimating a PSD for the acoustic signals 210.

Figure 3:
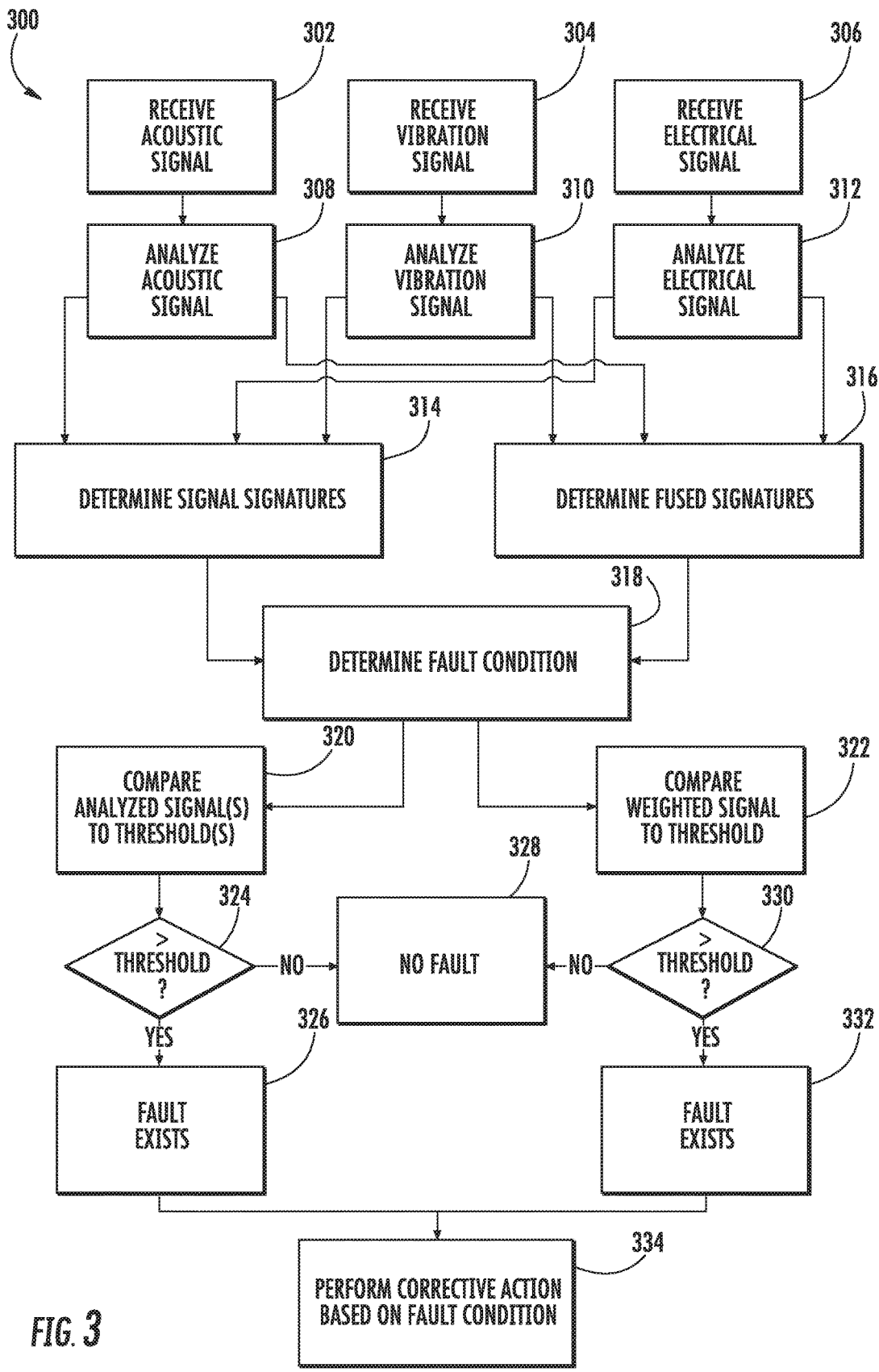
FIG. 3 depicts a flow diagram of a method according to example aspects of the present disclosure.

Referring now to FIG. 3, a flow diagram of an example method (300) for determining a fault condition according to an example embodiment of the present disclosure is depicted. The method 300 can be implemented by a control device or control system, such as control device 190 depicted in FIGS. 1 and 2, or a control device/system 810 depicted in FIG. 8. In addition, FIG. 3 depicts steps performed in a particular order for purposes of illustration and discussion. Those of ordinary skill in the art, using the disclosures provided herein, will understand that various steps of any of the methods disclosed herein can be adapted, omitted, rearranged, or expanded in various ways without deviating from the scope of the present disclosure.

At (302), the method (300) can include receiving an acoustic signal. For example, one or more acoustic signal measuring devices 185 can be positioned proximate to a drivetrain 140 in a wind turbine 160. In an embodiment, a plurality of acoustic signal measuring devices 185, such as an array of microphones, can be positioned proximate to the drivetrain 140. The one or more acoustic signal measuring devices 185 can be configured to measure an acoustic signal 210 during operation of the drivetrain 140, and can be configured to provide an acoustic signal 210 to a control device, such as a control device 190 and/or control device/system 810.

At (304), the method (300) can include receiving a vibration signal. For example, one or more vibration signal measuring devices 180 can be positioned proximate to a drivetrain 140, a generator 150, or other devices of the wind turbine 160. The one or more vibration signal measuring devices 180 can be configured to receive one or more vibration signals 202, such as stator vibrations, rotor vibrations, bearing vibrations, or other vibrations, and can be configured to provide a vibration signal 202 to a control device, such as a control device 190 and/or control device/system 810.

At (306), the method (300) can include receiving an electrical signal. For example, one or more electrical signal measuring devices 170, 171 can be coupled to a generator 150 and can be configured to measure a voltage, current, or other electrical signal from a generator 150. The one or more electrical signal measuring devices 170, 171 can be configured to receive one or more electrical signals 204, 206, and can be configured to provide an electrical signal 204, 206 to a control device, such as a control device 190 and/or control device/system 810.

At (308), the method (300) can include analyzing the acoustic signal to determine an analyzed acoustic signal. For example, a control device 190 and/or control device/system 810 can analyze the acoustic signal 210 to determine an analyzed acoustic signal 216. Similarly, at (310) and (312), the method (300) can include analyzing the vibration signal to determine an analyzed vibration signal 214, and analyzing the electrical signal to determine an analyzed electrical signal 212, respectively. For example, a control device 190 and/or control device/system 810 can analyze a vibration signal 202 to determine an analyzed vibration signal 214, and the control device 190 and/or control device/system 810 can analyze electrical signals 204, 206 to determine an analyzed electrical signal 212.

Figure 4:
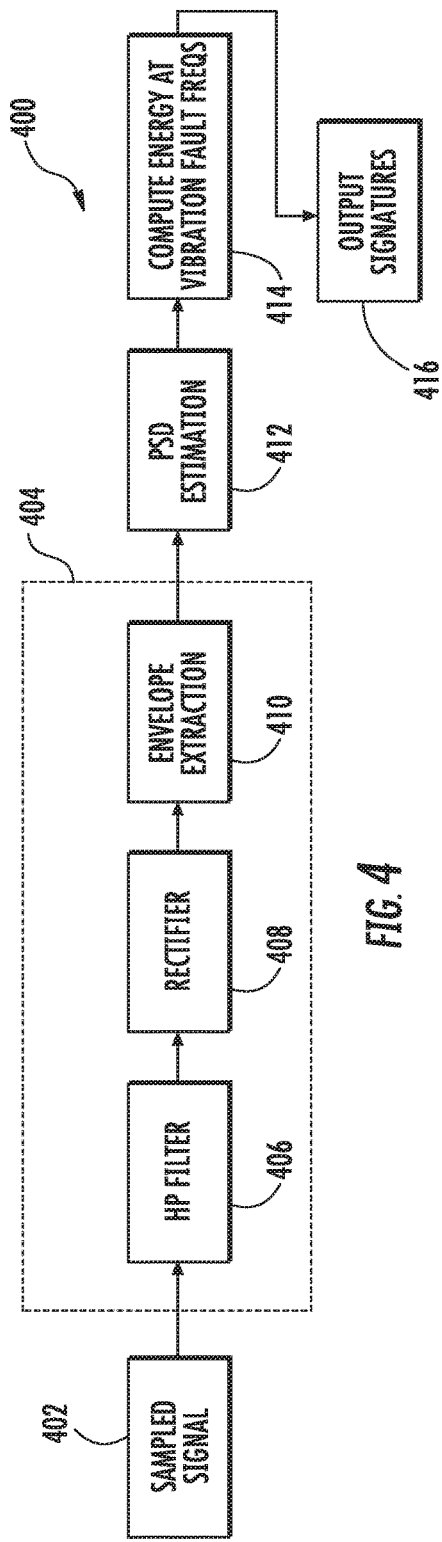
FIG. 4 depicts a flow diagram of a method according to example aspects of the present disclosure.

The method (300) can include various methods of analyzing acoustic, vibration, and electrical signals. For example, at (314), the method (300) can include determining one or more signal signatures. Referring now to FIG. 4, a flow diagram of a method (400) for determining a signal signature according to example aspects of the present disclosure is shown. The method (400) can be used to analyze one or more signals. In an embodiment, acoustic signals 210 and vibration signals 202 can be analyzed for indications of fault via spectral analysis applied to the envelope of the signals.

At (402), a signal can be sampled. For example, in an embodiment, a signal, such as an acoustic signal 210 or a vibration signal 202 can be sampled at a sampling rate of 50 kHz. For example, a sampled signal can be a 20 second signal sample. At (404), the spectrum of the envelope of each sampled signal can then be analyzed.

For example, the signal can first be provided to a high pass filter at (406). In an embodiment, the signal can be high pass filtered to 1.2 kHz using an order-9 Butterworth high pass filter. The filtered signal can then be provided to a rectifier at (408). Other suitable high pass filters can similarly be used to filter the signal.

At (410) the envelope of the signal can be extracted. For example, in an embodiment, the envelope can be extracted by applying the Hilbert transform to the absolute value of the signal. The envelope can be extracted using the following formula:

$$s_{env}(t)=|s(t)+j\,\hat{s}(t)| \qquad \text{Eq. 1}$$

where $s_{env}(t)$ is the envelope, s(t) is the absolute value of the filtered signal, and $\hat{s}(t)$ is the Hilbert transform of s(t). The envelope extraction can be performed by signal processing software. Other suitable envelope extraction methods can be used.

At (412), the spectrum of the envelope can be extracted. In an embodiment, a Welch PSD estimate using an FFT size of 131072 yielding a frequency resolution of 0.1953 Hz can be used. Other suitable spectral density estimation methods can be used.

At (414), the spectra of the signal(s) can then be analyzed at or around one or more predicted fault frequencies to check whether or not there is a significant deviation between the signal(s) received from the signal measuring device(s) obtained from the wind turbine 160 and a baseline signal obtained from the wind turbine 160 during operation in which the wind turbine 160 was healthy.

For example, a baseline signal can be obtained in which the wind turbine is healthy (i.e., the component is not faulty), and the baseline signal can be analyzed in order to determine an analyzed baseline healthy signal. For example, acoustic, vibration, and electrical signals measured in a healthy wind turbine 160 can all be used to determine respective baseline signals.

The predicted fault frequencies can be determined based on different types of fault conditions. For example, for a faulty gear with two worn teeth, the main vibration frequencies are expected to be at multiples of the shaft rotation frequency. In addition these vibrations may be modulated by vibrations at multiples of the mesh frequency, defined as the shaft frequency multiplied by the number of teeth in the gear. For a faulty gear with all worn teeth, the main vibration frequencies are expected to be at multiples of the mesh frequency. In addition these vibrations may be modulated by vibrations at multiples of the shaft rotation frequency. For a fault on the generator bearing's inner race, the vibration frequency in this case is given by the following equation:

$$f_{pred}=(N_b/2)*f_{shaft}*(1+(Db/Dp)*\cos(\beta)) \qquad \text{Eq. 2}$$

where $f_{pred}$ the predicted fault frequency, $N_b$ is the number of balls in the bearing, $f_{shaft}$ is the rotation frequency of the shaft, Dp is the pitch diameter, Db is the ball diameter, and $\beta$ is the contact angle. Additionally, vibrations may also occur at multiples of the calculated frequency. Similarly, other predicted fault frequencies can be determined for other components in wind turbine 160.

For electrical signals, these vibrations can be further modulated by the fundamental electrical frequency, and hence the signature frequencies can be further shifted from the predicted mechanical frequencies by integer multiples of the fundamental electrical frequency. Thus, the predicted electrical signature frequencies can be given by the following equation:

$$f_{predelec}=|n*(f_{fund}+f_{pred})| \qquad \text{Eq. 3}$$

where n is an integer, $f_{pred}$ is the predicted fault frequency as determined by Eq. 2, and $f_{fund}$ is the fundamental electrical frequency. In some embodiments, integer values of −2, −1, 1, and 2 can be used to determine prominent predicted electrical signature frequencies.

Due to inaccuracies in the part dimensions and the speed and sampling rate measurements, however, the predicted fault frequencies may not precisely correspond to the observed frequencies. In an embodiment, in order to account for such discrepancies, a maximum reading of the spectrum within an interval centered at the calculated frequency can be used for each analyzed signal. For example, in an embodiment, the interval width can be determined using the following formula:

$$\min(\max(2\% \text{ of } f_{pred}, 0.4 \text{ Hz}), 4 \text{ Hz}) \qquad \text{Eq. 4}$$

where $f_{pred}$ is the predicted frequency. Equation 4 can allow for a maximum offset of 1% frequency or 2 Hz, whichever is smaller. Additionally, of the calculated the maximum reading of the spectrum within an interval of width at least 0.4 Hz centered at the predicted fault frequency can be selected.

At (416), in an embodiment, the maximum reading of the spectra for each predicted fault frequency can be output as the signal signature(s) to be used for determining whether a fault condition exists in a component.

Figure 5:
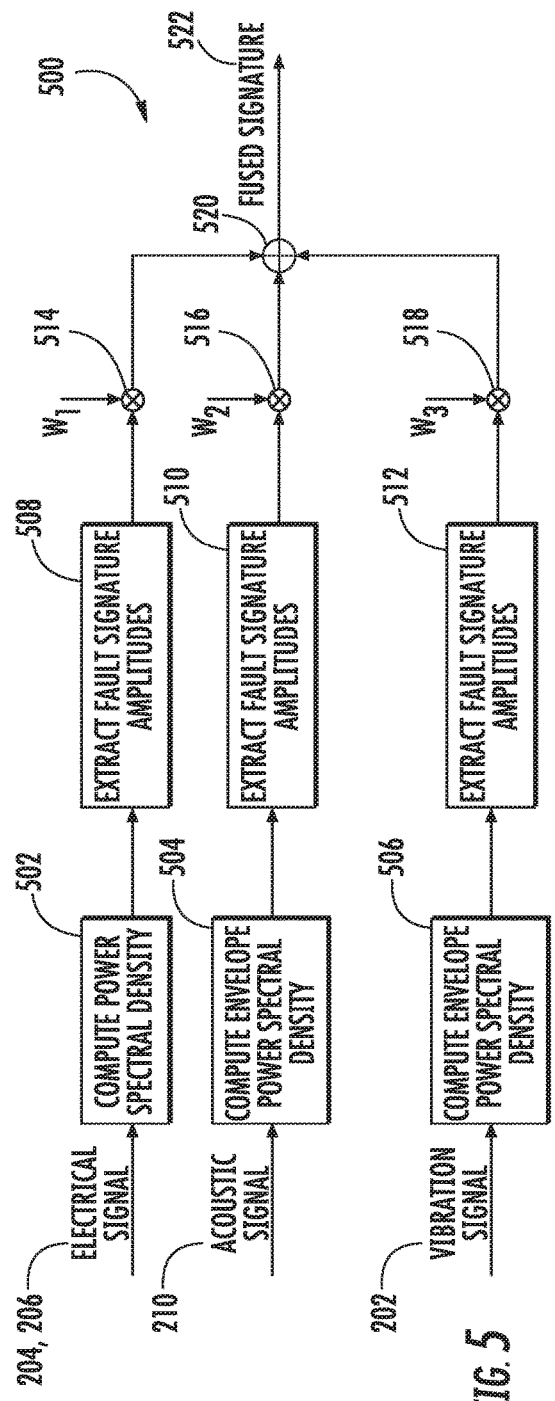
FIG. 5 depicts a flow diagram of a method according to example aspects of the present disclosure.

Referring back to FIG. 3, the method (300) can include additional methods of analyzing acoustic, vibration, and electrical signals. For example, at (316), the method (300) can include determining a fused signature. Referring now to FIG. 5, a flow diagram of a method (500) for determining a fused signature according to example aspects of the present disclosure is shown.

At (502), the method (500) can include analyzing the electrical signal, such as, for example, by computing the PSD of the electrical signal. For example, an electrical signal 204, 206 can be provided to a control device 190 and/or control device/system 810. A PSD estimate can be performed on the electrical signal 204, 206, such as a Welch PSD estimation or other PSD estimation of a line-line voltage signal at the signature frequencies corresponding to a fault of interest.

At (504), the method (500) can include analyzing the acoustic signal, such as, for example, by extracting the envelope of the acoustic signal and estimating a PSD of the acoustic signal. For example, an acoustic signal 210 can be provided to a control device 190 and/or control device/system 810. In an embodiment, an envelope for the signal can be extracted using a Hilbert transform, and a PSD can be estimated using the Welch PSD estimation technique as described herein. Additionally and/or alternatively, any other suitable envelope extraction or PSD estimation methods can be used. The PSD of the acoustic signal envelope at the acoustic signature frequencies corresponding to a fault of interest can be performed.

At (506), the method (500) can include analyzing the vibration signal, such as, for example, by extracting the envelope of the vibration signal and estimating a PSD of the vibration signal. For example, a vibration signal 202 can be provided to a control device 190 and/or control device/system 810. In an embodiment, an envelope for the signal can be extracted using a Hilbert transform, and a PSD can be estimated using the Welch PSD estimation technique as described herein. Additionally and/or alternatively, any other suitable envelope extraction or PSD estimation methods can be used. The PSD of the vibration signal envelope at the acoustic signature frequencies corresponding to a fault of interest can be performed.

At (508), (510), and (512), the fault signature amplitudes for the electrical signal, acoustic signal, and vibration signal, respectively, can be extracted. For example, different fault conditions may have different signature fault frequencies associated with each specific fault condition. For each signature fault frequency and each respective signal, the square root of the power spectrum can be computed, and can be referred to as the measurement at the signature frequency for the respective signal.

At (514) the fault signature amplitude for the analyzed electrical signal 204, 206 can be combined with a corresponding weighting parameter $w_1$. Similarly, at (516) and (518), the fault signature amplitudes for an analyzed acoustic signal 210 and analyzed vibration signal 202 can similarly be combined with a respective corresponding weighting parameters $w_2$ and $w_3$. The weighting parameters $w_1$, $w_2$, and $w_3$ can be calculated for each signature fault frequency for each of the respective signals. At (520), the weighted, analyzed electrical signal 204, 206, the weighted, analyzed acoustic signal 210, and the weighted, analyzed vibration signal 202 can be combined to create a fused signature 522.

Figure 6:
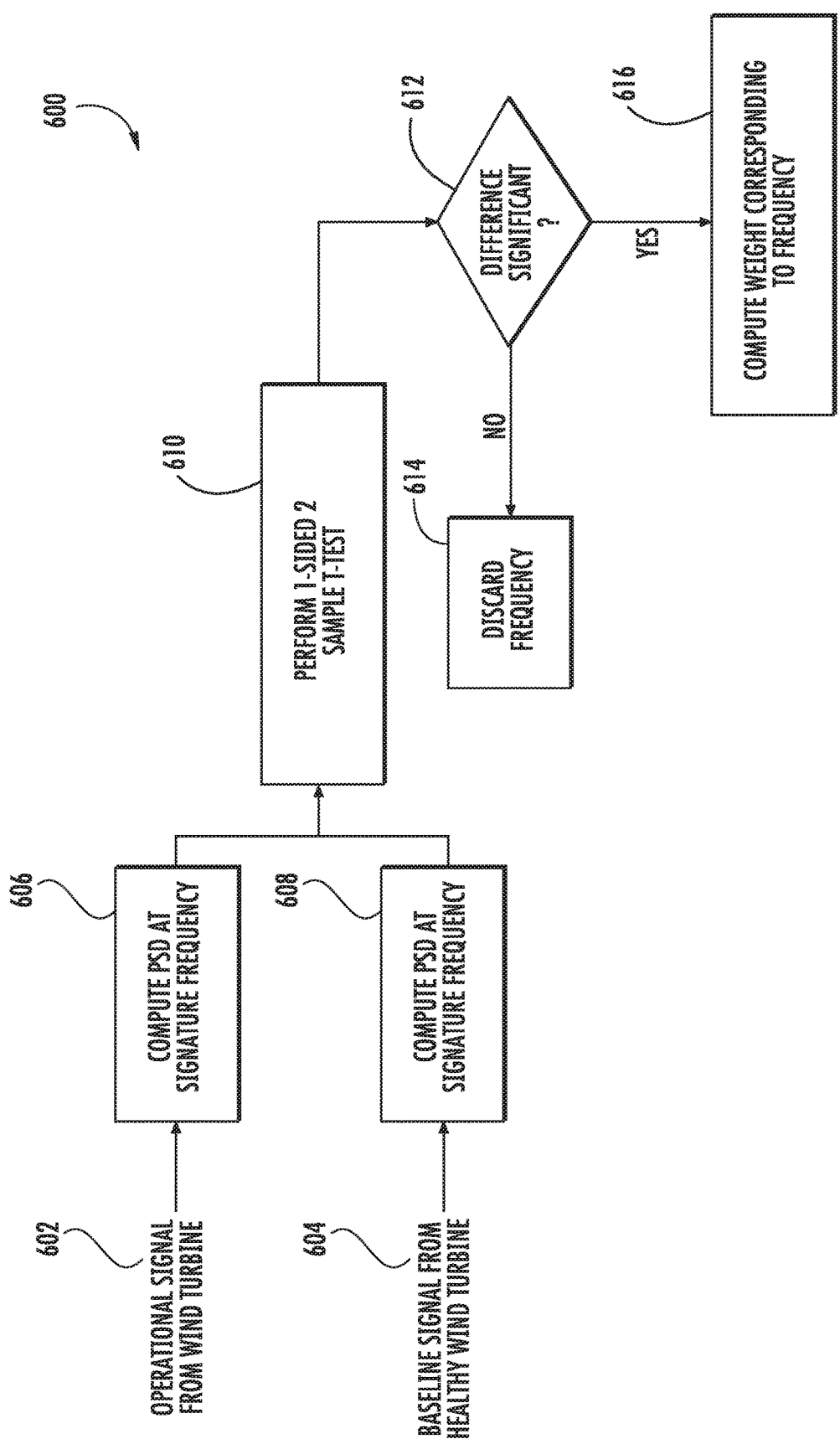
FIG. 6 depicts a flow diagram of a method according to example aspects of the present disclosure.

Referring now to FIG. 6, an example method (600) for identifying signature fault frequencies with a significant difference and determining corresponding significant signature fault frequency weighting parameters is depicted. The method (600) can be used to identify signature fault frequencies for which the fault signature amplitudes are extracted for creating a fused signature 522.

As there are multiple candidate frequencies at which vibration signatures can appear, such as predicted fault frequencies as described herein, it may be important to select the significant fault frequencies which show a significant increase in readings under the faulty condition relative to that under the healthy conditions.

As shown, at (606) and (608) a PSD at a signature fault frequency can be computed for an operational signal, such as an operational signal from a wind turbine 602 and a respective baseline signal, such as a baseline signal from a healthy wind turbine 604, respectively. The signature fault frequency can be a frequency associated with a particular fault condition, such as a predicted fault frequency as discussed herein. The operational signal from the wind turbine 602 can be, for example, an acoustic signal, a vibration signal, or an electrical signal, such as a signal from a wind turbine which is being examined for a fault, such as a vibration signal 202, an electrical signal 204, 206, or an acoustic signal 210. The respective baseline signal, such as a baseline signal from a healthy turbine 604, can be, for example, a corresponding acoustic, vibration, or electrical signal previously obtained from a wind turbine known to not be experiencing a fault condition, such as an acoustic, vibration, or electrical signal obtained from a healthy wind turbine 160 during operation of the wind turbine 160. The PSD can be, for example, computed using a Welch PSD estimation or other PSD estimation as described herein.

At (610), at each signature frequency and for each signal, a one-tailed two-sample T-test between the measurements obtained under the operational and baseline conditions can be performed to determine whether there is a statistically significant increase in the measurements under the operational condition over those under baseline conditions.

At (612), the method (600) can include determining whether the difference between the two signals is significant. For example, after computing the 1-sided two sample t-test statistic to evaluate the p-value for the null hypothesis that the PSD measurements from the two conditions have the same mean, the null hypothesis can be rejected if the p-value is below a threshold and it can be concluded that the increase in mean is significant.

At (614), the method (600) can include discarding the signature fault frequencies which do not show a statistically significant increase in the measurements in the operational signal 602 relative to the baseline signal 604. In an embodiment, the p-value cutoff required to indicate statistical significance can be user-specified. In an embodiment, a p-value threshold of 0.01 and/or 0.05 can be used.

At (616), the method (600) can include computing a weighting parameter corresponding to the significant signature fault frequency. In an embodiment, the weighting parameter for each signal can be determined based at least in part on a mean value in a variance value of a difference between the operational signal 602 and the baseline signal 604 at one or more signature fault frequencies.

For example, in order to determine a weighting parameter, the difference in means between the operational and baseline signals can be computed and the common variance of the signals can be computed, and a weighting parameter can be computed using the following equation:

$$w = (m_{operational} - m_{healthy}) / ((\sigma^2_{operational} + \sigma^2_{healthy})/2) \qquad \text{Eq. 5}$$

where w is the weighting parameter, $m_{operational}$ and $m_{healthy}$ are the mean values of the operational and healthy signals, respectively, and $\sigma_{operational}$ and $\sigma_{healthy}$ are the variance values of the operational and healthy signals, respectively. In this way, the weighting parameter corresponding to the signature frequency can given by the ratio of the difference in means to the variance.

Referring back to FIG. 3, at (318), the method (300) can include determining a fault condition for the component based at least in part on the analyzed signals. The analyzed signals can be, for example, one or more of an analyzed acoustic signal 216, an analyzed vibration signal 214, and an analyzed electrical signal 212. For example, at (320), the method (300) can include comparing an analyzed signal to one or more thresholds. The one or more thresholds can be one or more thresholds at one or more signature fault frequencies. For example, a signature fault frequency can be determined based at least in part on a baseline signal from a healthy wind turbine 160 and an operational signal from a wind turbine. For example, in the healthy turbine, the component, such as a gear, bearing, race, or other component, can be a component without a defect, and a signal measuring device can measure the signal. Similarly, in the wind turbine being examined, the component can be a faulty, worn, or other component, such as a gear with a broken tooth. Both the baseline signal and the operational signal can be analyzed as described herein. In some embodiments, the one or more thresholds can be determined based on a difference between the analyzed baseline signal and the analyzed operational signal at the one or more signature fault frequencies. For example, the thresholds can be set at approximately the difference between the analyzed baseline signal and analyzed operational signal at the signature fault frequencies. Additionally and/or alternatively, the threshold can be another threshold. The one or more thresholds can correspond to various faulty components. For example, a first threshold at a first signature fault frequency can be used to determine whether a fault exists in a bearing, while a second threshold at a second signature fault frequency can be used to determine whether a fault exists in a gear. Additionally, in one or more embodiments, a plurality of thresholds can be used for diagnostic purposes, such as for measuring wear of components in order to provide maintenance on a wind turbine 160.

The analyzed signal(s) can be compared to the one or more thresholds by, for example, comparing the magnitude of the envelope spectrum of the analyzed signal(s) at the one or more signature fault frequencies to the one or more thresholds. If, at (324), the analyzed signal exceeds the threshold, then at (326), a fault can be determined to exist. If, however, at (324) the analyzed signal does not exceed the threshold, then at (328), no fault exists.

In an embodiment, the one or more analyzed signals can include an analyzed acoustic signal and an analyzed vibration signal. The analyzed acoustic signal can be compared to a first threshold, and the analyzed vibration signal can be compared to a second threshold. When the analyzed acoustic signal exceeds the first threshold and the analyzed vibration signal exceeds the second threshold, a fault condition in a component can be determined to exist.

Similarly, at (322), the method (300) can include comparing the fused weighted signal to a threshold. For example, a fused weighted signal can be determined by combining the weighted linear combination of all the measurements at all significant signature frequencies. If at (330), the fused weighted signal exceeds a threshold, then at (332), a fault can be determined to exist. If, however, (at 330), the fused weighted signal does not exceed the threshold, then at (328) no fault exists.

A plurality of thresholds can be used to detect fault conditions based on a fused weighted signal or a plurality of analyzed signals. For example, a detection system can be adapted to raise alarms at different severity levels of damage by setting appropriate thresholds. Further, a detection system can monitor progressive degradation of faults to predict failures and schedule maintenance in advance of a failure.

At (334), the method can include performing a corrective action for the wind turbine based at least in part on the fault condition. For example, if a fault condition is determined to exist, a corrective action can include performing maintenance on the wind turbine to repair or replace the component of the wind turbine that is determined to be the cause of the fault. For example, a bearing, gear, or race can be repaired and/or replaced in order to correct the fault condition. Additionally and/or alternatively, the wind turbine can be scheduled for preventive maintenance at a future time period. For example, using one or more thresholds, a fault condition can indicate that a particular component will need to be repaired and/or replaced at a future time period. In some implementations, the corrective action can include scheduling maintenance at the future time period, such as during a routine maintenance period. In this way, the systems and methods according to example aspects of the present disclosure can allow for performing a corrective action on a wind turbine based at least in part on a fault condition.

Figure 7:
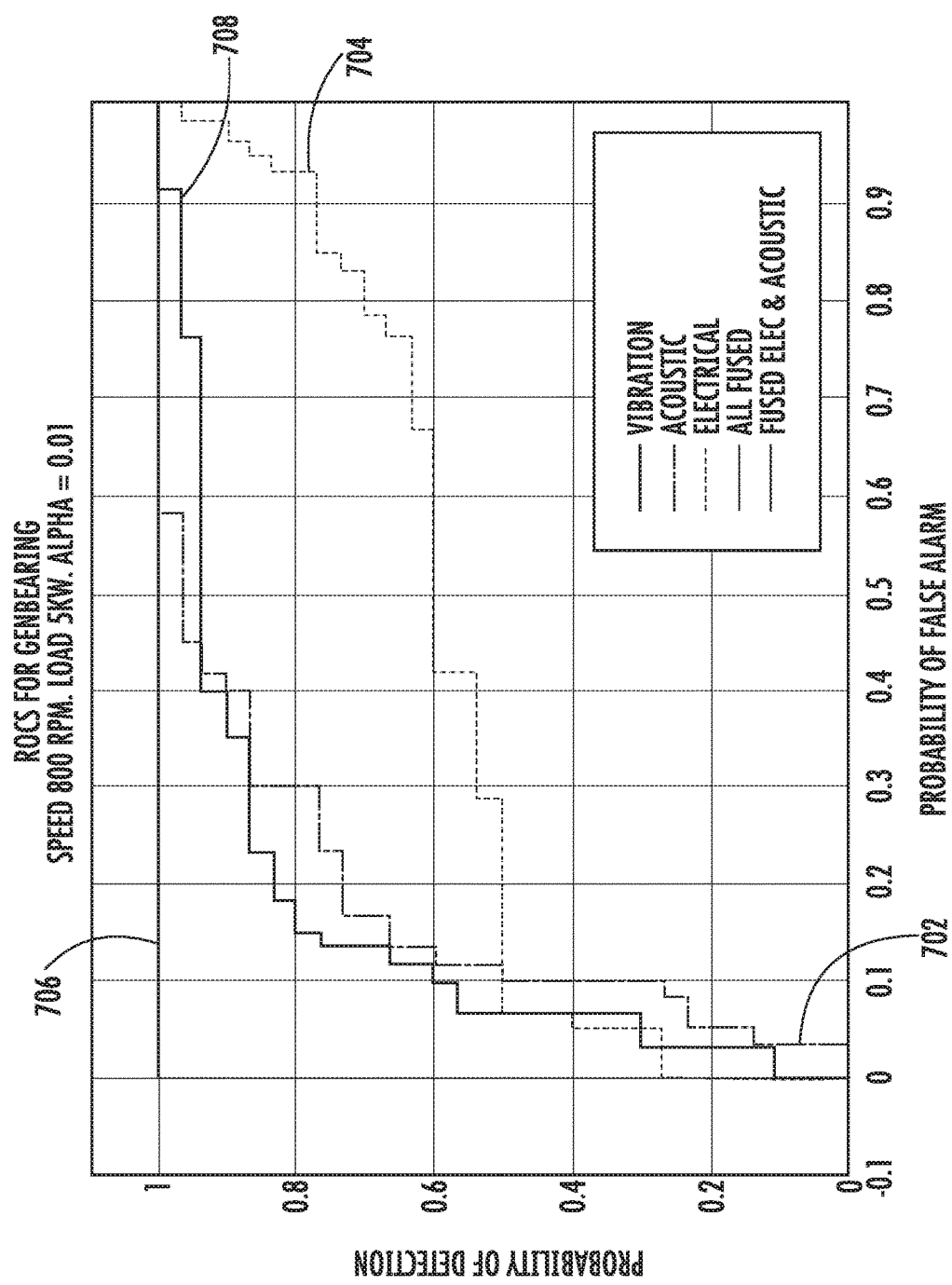
FIG. 7 depicts an example graph of a simulation showing the probability of detecting a fault using example aspects of the present disclosure.

FIG. 7 depicts an example graph of a simulation showing the probability of detecting a fault using example aspects of the present disclosure. FIG. 7 depicts a plot of receiver operating characteristics (ROCs) for a generator bearing at 800 RPM under a load of 5 kW and a p-value of 0.01. On the x-axis, a probability of a false alarm is shown from 0.0 to 1.0, with 0.0 corresponding to a 0% probability and 1.0 corresponding to a 100% probability. On the y-axis, a probability of detection is shown from 0.0 to 1.0, with a similar 0-100% probability.

As shown, five signals and signal combinations are graphed a vibration only signal (not shown due to overlapping signals), an acoustic only signal 702, an electrical signal 704, a fused signal of vibration, acoustic, and electrical signals 706, and a fused signal of electric and acoustic signals 708. As shown by curves 706 and 708, the fused signals can provide an improved probability of detection at a reduced probability of false alarm over the individual signals 702 and 704.

Figure 8:
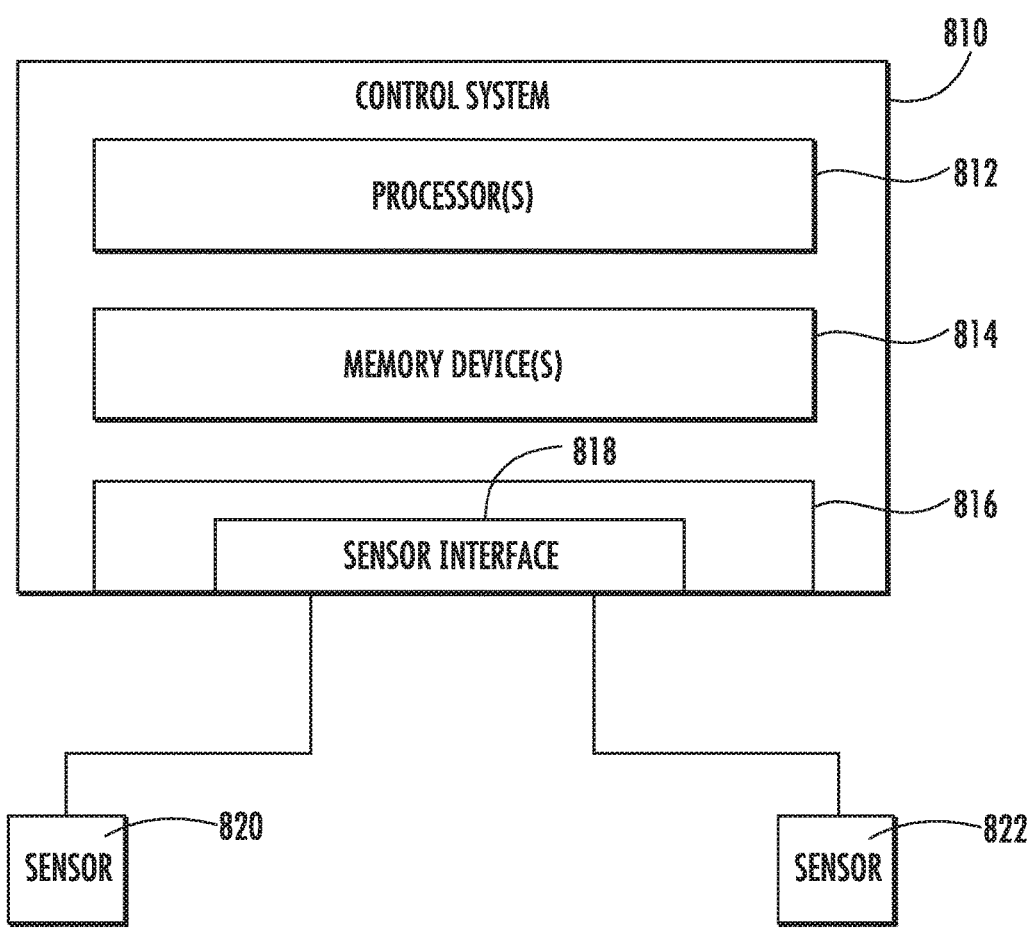
FIG. 8 depicts an example control device according to example aspects of the present disclosure.

Referring now to FIG. 8, an example control device/system 810 according to example embodiments of the present disclosure is depicted. The control device/system 810 can be used, for example, as a control device 190 as shown in FIGS. 1 and 2. In some embodiments, the control device/system 810 can include one or more processor(s) 812 and one or more memory device(s) 814. The processor(s) 812 and memory device(s) 814 can be distributed so that they are located at one more locales or with different devices.

The processor(s) 812 and memory device(s) 814 can be configured to perform a variety of computer-implemented functions and/or instructions (e.g., performing the methods, steps, calculations and the like and storing relevant data as disclosed herein). The instructions when executed by the processor(s) 812 can cause the processor(s) 812 to perform operations according to example aspects of the present disclosure. For instance, the instructions when executed by the processor(s) 812 can cause the processor(s) 812 to implement the method of FIGS. 3-6 (300, 400, 500, 600) discussed herein.

Additionally, the control device 810 can include a communication interface 816 to facilitate communications between the control device 810 and various components of a wind turbine, wind turbine system, wind farm, or power system, including power parameters, current parameters, voltage parameters, vibration parameters, acoustic parameters, or other parameters described herein. Further, the communication interface 818 can include a sensor interface 818 (e.g., one or more analog-to-digital converters) to permit signals transmitted from one or more sensors 820, 822 to be converted into signals that can be understood and processed by the processor(s) 812. It should be appreciated that the sensors (e.g. sensors 820, 822) can be communicatively coupled to the communications interface 818 using any suitable means, such as a wired or wireless connection. The signals can be communicated using any suitable communications protocol. The sensors (820, 822) can be, for example, electrical signal measuring devices, such as voltage sensors, current sensors, or power sensors, vibration signal measuring devices, acoustic signal measuring devices, or any other sensor device or signal measuring device described herein.

As such, the processor(s) 812 can be configured to receive one or more signals from the sensors 820 and 822. For instance, in some embodiments, the processor(s) 812 can receive signals indicative of an acoustic signal from the sensor 820. In some embodiments, the processor(s) 812 can receive signals indicative of vibration from sensor 822.

As used herein, the term "processor" refers not only to integrated circuits referred to in the art as being included in a computer, but also refers to a control device, a microcontrol device, a microcomputer, a programmable logic control device (PLC), an application specific integrated circuit, and other programmable circuits. Additionally, the memory device(s) 814 can generally include memory element(s) including, but not limited to, computer readable medium (e.g., random access memory (RAM)), computer readable non-volatile medium (e.g., a flash memory), a compact disc-read only memory (CD-ROM), a magneto-optical disk (MOD), a digital versatile disc (DVD) and/or other suitable memory elements. Such memory device(s) 814 can generally be configured to store suitable computer-readable instructions that, when implemented by the processor(s) 812, configure the control device 810 to perform the various functions as described herein.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for determining a fault condition for a component of a drivetrain in a wind turbine, comprising:
    detecting an audible acoustic signal with at least one acoustic signal measuring device positioned proximate to a mechanical component of the wind turbine;
    detecting a vibration resulting from a rotation of a wind turbine component with at least one vibration signal measuring device positioned proximate to at least one of a drivetrain, a generator, or other device of the wind turbine,
    transmitting the acoustic signal and the vibration signal to a controller;
    receiving the acoustic signal from the at least one acoustic signal measuring device;
    receiving the vibration signal from the at least one vibration signal measuring device;
    analyzing the acoustic signal to determine an analyzed acoustic signal by extracting an envelope from the acoustic signal and estimating a power spectral density for the acoustic signal;
    analyzing the vibration signal to determine an analyzed vibration signal by extracting an envelope from the vibration signal and estimating a power spectral density for the vibration signal;
    determining a fault condition for the component based at least in part on the analyzed acoustic signal and analyzed vibration signal; and
    performing a corrective action for the wind turbine based at least in part on the fault condition.

2. The method of claim 1, wherein analyzing the acoustic signal to determine an analyzed acoustic signal further comprises:
    sampling the acoustic signal at a determined sampling rate,
    providing the sampled acoustic signal to a high-pass filter, and
    providing the filtered acoustic signal to a rectifier; and
    wherein analyzing the vibration signal to determine an analyzed vibration signal comprises:
    sampling the vibration signal at a determined sampling rate,
    providing the sampled vibration signal to a high-pass filter, and
    providing the filtered vibration signal to a rectifier.

3. The method of claim 1, wherein determining a fault condition comprises:
    comparing the analyzed acoustic signal to a first threshold at a signature fault frequency, and
    comparing the analyzed vibration signal to a second threshold at the signature fault frequency.

4. The method of claim 3, wherein a fault condition in the component is determined to exist when the analyzed acoustic signal exceeds the first threshold at the signature fault frequency and the analyzed vibration signal exceeds the second threshold at the signature fault frequency.

5. The method of claim 1, further comprising:
    receiving an electrical signal from an electrical signal measuring device; and
    analyzing the electrical signal to determine an analyzed electrical signal;
    wherein the fault condition for the component is based at least in part on the analyzed electrical signal.

6. The method of claim 5, wherein analyzing each of the acoustic signal, the vibration signal, and the electrical signal comprises:
    estimating a power spectral density for each of the acoustic signal, the vibration signal, and the electrical signal.

7. The method of claim 5, wherein analyzing each of the acoustic signal, the vibration signal, and the electrical signal comprises:
    extracting one or more fault signature amplitudes for each of the acoustic signal, the vibration signal, and the electrical signal.

8. The method of claim 7, wherein the one or more fault signature amplitudes for each respective signal are extracted at one or more signature fault frequencies based at least in part each respective signal and a respective baseline signal for the wind turbine.

9. The method of claim 5, wherein analyzing each of the acoustic signal, the vibration signal, and the electrical signal comprises:

determining a weighting parameter for each of the acoustic signal, the vibration signal, and the electrical signal; and wherein the fault condition for the component is determined based at least in part on the weighting parameter for each of the acoustic signal, the vibration signal, and the electrical signal.

10. The method of claim 9, wherein the weighting parameter for each of the acoustic signal, the vibration signal, and the electrical signal is determined based at least in part on a mean value and a variance value of a difference between each respective signal and a respective baseline signal at one or more signature fault frequencies.

11. A control system, comprising:
at least one acoustic signal measurement device positioned proximate to a mechanical component of a wind turbine and configured to detect an audible acoustic signal;
an electrical signal measurement device;
at least one vibration signal measurement device positioned proximate to at least one of a drivetrain, a generator, or other device of the wind turbine and configured to detect a vibration resulting from a rotation of the wind turbine component; and
one or more processors and one or more memory devices configured to store instructions that when executed by the one or more processors cause the one or more processors to perform operations, the operations configured to:
receive first data indicative of an audible acoustic signal from the at least one acoustic signal measurement device;
receive second data indicative of a vibration signal from the at least one vibration signal measurement device;
receive third data indicative of an electrical signal from the electrical signal measurement device;
process the first data, second data, and third data by estimating a power spectral density for each respective data to determine a first processed data, a second processed data, and a third processed data; and
determine a fault condition based at least in part on the first processed data, the second processed data, and the third processed data.

12. The control system of claim 11, wherein the one or more processors are configured to process each of the first data, second data, and third data by:
sampling at least one of the acoustic signal, the vibration signal, or the electrical signal at a determined sampling rate,
providing the sampled signal to a high-pass filter, and
providing the filtered signal to a rectifier.

13. The control system of claim 11, wherein the one or more processors are configured to process each of the first data, second data, and third data by extracting one or more fault signature amplitudes for each respective data.

14. The control system of claim 13, wherein the one or more fault signature amplitudes for each respective data are extracted at one or more signature fault frequencies based at least in part each respective data and data indicative of a respective baseline signal.

15. The control system of claim 11, wherein the one or more processors are configured to process each of the first data, second data, and third data by determining a weighting parameter for each respective data; and
wherein the fault condition is determined based at least in part on the weighting parameter for each respective data.

16. The control system of claim 15, wherein the weighting parameter for each of the first data, second data, and third data is determined based at least in part on a mean value and a variance value of a difference between each respective data and data indicative of a respective baseline signal at one or more signature frequencies.

17. A wind turbine system, comprising:
a wind turbine comprising a drivetrain, the drivetrain comprising a plurality of components, the plurality of components comprising a plurality of bearings, races, and gears;
at least one acoustic signal measurement device positioned proximate to a mechanical component of the wind turbine and configured to detect an audible acoustic signal;
an electrical signal measurement device;
at least one vibration signal measurement device positioned proximate to at least one of a drivetrain, a generator, or other device of the wind turbine and configured to detect a vibration resulting from a rotation of the wind turbine component; and
one or more processors and one or more memory devices configured to store instructions that when executed by the one or more processors cause the one or more processors to perform operations, the operations comprising:
receive first data indicative of an audible acoustic signal from the acoustic signal measurement device;
receive second data indicative of a vibration signal from the vibration signal measurement device;
receive third data indicative of an electrical signal from the electrical signal measurement device;
process the first data, second data, and third data by estimating a power spectral density and extracting one or more fault signature amplitudes for each respective data to determine a first processed data, a second processed data, and a third processed data; and
determine a fault condition for at least one component in the plurality of components based at least in part on the first processed data, the second processed data, and the third processed data.

18. The wind turbine system of claim 17, wherein the one or more processors are configured to process each of the first data, second data, and third data by:
sampling at least one of the acoustic signal, the vibration signal, or the electrical signal at a determined sampling rate,
providing the sampled signal to a high-pass filter, and
providing the filtered signal to a rectifier.

19. The wind turbine system of claim 18, wherein the one or more fault signature amplitudes for each respective data are extracted at one or more signature fault frequencies based at least in part each respective data and data indicative of a respective baseline signal.

20. The wind turbine system of claim 17, wherein the one or more processors are configured to process each of the first data, second data, and third data by determining a weighting parameter for each respective data;
wherein the fault condition for the component is determined based at least in part on the weighting parameter for each respective data; and
wherein the weighting parameter for each respective data is determined based at least in part on a mean value and a variance value of a difference between each respective data and data indicative of a baseline signal at one or more signature frequencies.

* * * * *